United States Patent [19]
Choi

[11] Patent Number: 5,566,111
[45] Date of Patent: Oct. 15, 1996

[54] METHOD FOR PROGRAMMING A NONVOLATILE MEMORY

[75] Inventor: Woong-Lim Choi, Kyungki-do, Rep. of Korea

[73] Assignee: LG Semicon Co., Ltd., Chungcheongbuk-do, Rep. of Korea

[21] Appl. No.: 542,651

[22] Filed: Oct. 13, 1995

[30] Foreign Application Priority Data

Sep. 18, 1995 [KR] Rep. of Korea .................. 30440/1995

[51] Int. Cl.$^6$ .................................................. G11C 11/34
[52] U.S. Cl. .................. 365/185.22; 365/185.20; 365/185.21; 365/185.24
[58] Field of Search .................. 365/185.22, 185.20, 365/185.21, 185.24, 185.14, 189.01

[56] References Cited

U.S. PATENT DOCUMENTS

| | | | |
|---|---|---|---|
| 4,331,968 | 5/1982 | Gosney, Jr. et al. | 357/23 |
| 5,043,940 | 8/1991 | Harari | 365/168 |
| 5,047,362 | 9/1991 | Bergemont | 437/52 |
| 5,163,021 | 11/1992 | Mehrotra et al. | 365/185 |
| 5,268,318 | 12/1993 | Harari | 437/43 |
| 5,386,422 | 1/1995 | Endoh et al. | 365/185.22 X |
| 5,394,362 | 2/1995 | Banks | 365/189.01 |
| 5,422,842 | 6/1995 | Cernea et al. | 365/185 |

OTHER PUBLICATIONS

M. Bauer et al., "A Multilevel-Cell 32Mb Flash Memory", Digest of Technical Papers, IEEE International Solid-State Circuits Conference, pp. 132–133, Feb. 1995.

R. Cernea et al., "A 34Mb 3.3V Serial Flash EEPROM for Solid-State Disk Applications", Digest of Technical Papers, IEEE International Solid-State Circuits Conference, pp. 126–127, Feb. 1995.

*Primary Examiner*—Son T. Dinh
*Attorney, Agent, or Firm*—Morgan, Lewis & Bockius LLP

[57] ABSTRACT

A method for programming a nonvolatile memory cell having a control gate, a floating gate, a drain, a source, and a channel region disposed between the drain and source, the method includes the steps of applying a first voltage to the control gate to form an inversion layer in the channel region, the first voltage being varied to program at least two threshold levels of the memory cell, applying a second voltage to the drain and a third voltage to the source, the second voltage being greater than the third voltage, monitoring a current flowing between the drain and the source during the programming of the at least two threshold levels, and terminating any one of the first voltage, the second voltage, and the third voltage when the monitored current reaches a preset reference current to thereby stop the programming of the at least two threshold levels.

19 Claims, 5 Drawing Sheets

METHOD FOR PROGRAMMING A NONVOLATILE MEMORY

BACKGROUND OF THE INVENTION

1. Field of the Invention

The present invention relates to a method for programming a memory, and more particularly, to a method for programming a nonvolatile semiconductor memory.

2. Discussion of the Related Art

Generally, nonvolatile semiconductor memories, such as electrically erasable and programmable read-only memories (EEPROMs) and flash EEPROMs, intended as mass storage media possess an excessive cost per bit. A study on a multibit cell has been currently carried out as a method to solve the above-mentioned problem.

The packing density of a nonvolatile memory corresponds with the number of memory cells on a one-to-one basis. A multibit cell stores at least two data bits in a single memory cell, thereby significantly increasing the storage packing density of the data in the same chip area without reducing a memory cell size.

In order to embody the multibit cell, more than three threshold voltage levels must be programmed for each memory cell. For example, in order to store two data bits per cell, respective cells become programmable by four threshold level steps, i.e., $2^2=4$. As a result, the four threshold level steps logically correspond to respective logic states of 00, 01, 10, and 11.

In the above-described multilevel programming, it is critical that respective threshold voltage levels have a statistical distribution of approximately 0.5 V. Consequently, as the distribution decreases by accurately adjusting the respective threshold levels, more levels can be programmed allowing the number of bits per cell to be increased.

To decrease the above voltage distribution, a technique for repeatedly programming and verifying has generally been used in the programming. In this technique, a series of voltage pulses is applied to a cell to program a nonvolatile memory cell at a desired threshold level. A reading process between the respective voltage pulses verifies whether the cell reaches the desired threshold level. During verification, when the verified threshold level value reaches the desired threshold level value, the programming process stops.

In the system for repeatedly programming and verifying, it is difficult to reduce the error distribution of the threshold levels due to a program voltage pulse width. Furthermore, the algorithm of repeatedly programming and verifying requires an additional circuit, thereby increasing the peripheral circuit area of a chip. Moreover, this method increases the programming time.

Figure 1A:
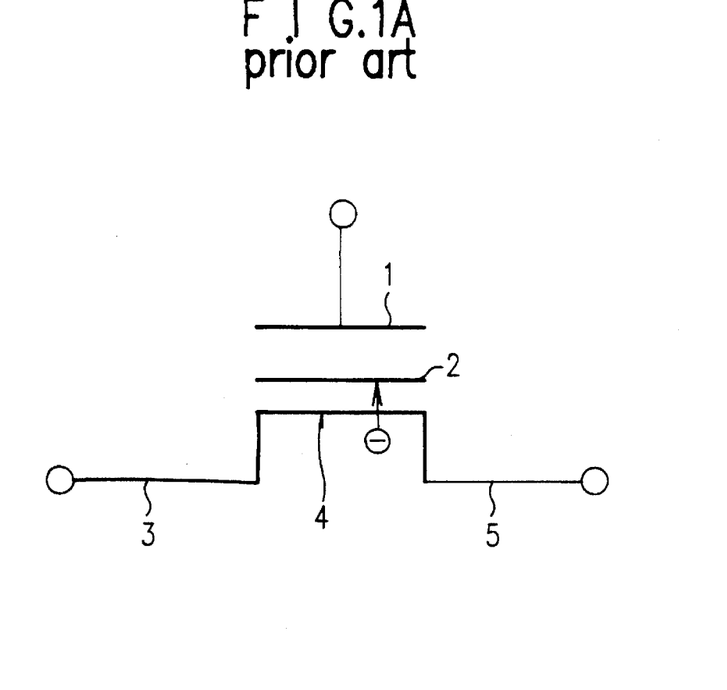
FIG. 1A is a circuit diagram of a general nonvolatile memory cell.

To eliminate the above-stated drawbacks, R. Cernea of SunDisk Co. introduced a simultaneous programming and verifying technique (U.S. Pat. No. 5,422,842). FIG. 1A shows the symbol and circuit diagram of the EEPROM of Cernea. The EEPROM cell consists of a control gate 1, a floating gate 2, a source 3, a channel region 4, and a drain 5.

Figure 1B:
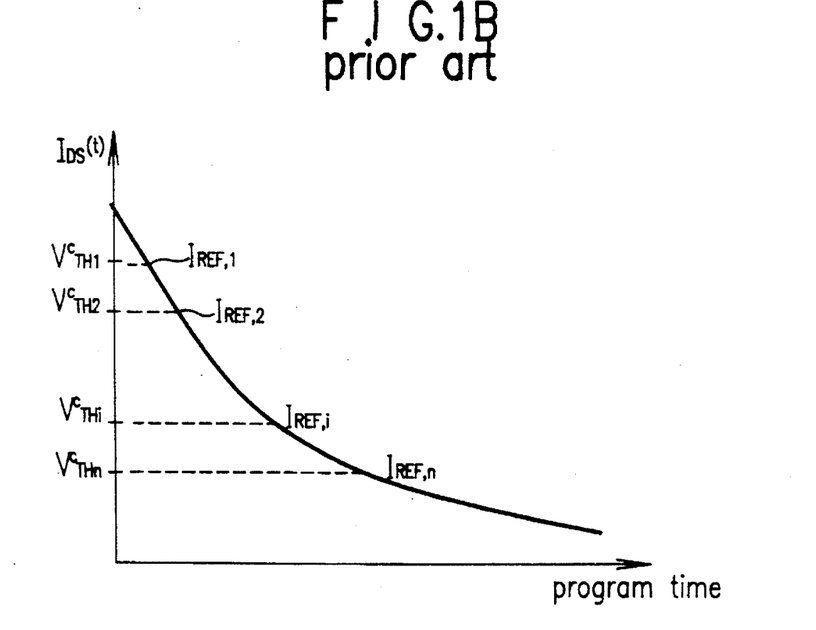
FIG. 1B is a graph illustrating an automatic verification programming principle of the nonvolatile memory cell of FIG. 1A.

When a voltage sufficient to cause programming is applied to control gate 1 and drain 5, a current flows between drain 5 and source 3. The current is compared to a given reference current to generate a programming completion signal when the current is equal to or less than the reference current. This process is illustrated in FIG. 1B.

In this technique, the programming state is automatically verified at the same time as the programming to slightly counteract the drawbacks of repeatedly programming and verification. However, the threshold voltage level applied to control gate 1 of the memory cell is not adjusted.

U.S. Pat. No. 5,043,940 to Harari performs the multilevel programming by changing reference currents corresponding to respective levels. As shown in FIG. 1B, the reference currents for verification are not explicitly or linearly related to the threshold voltages of a cell. Therefore, the multilevel cannot be directly and effectively controlled in the current-controlled method.

SUMMARY OF THE INVENTION

Accordingly, the present invention is directed to a method for programming a nonvolatile memory that substantially obviates one or more of the problems due to limitations and disadvantages of the related art.

An object of the present invention is to provide a method for programming a nonvolatile memory capable of simultaneously verifying threshold levels during the execution of two-level or multilevel programming.

Another object of the present invention is to provide a method for programming nonvolatile memory for adjusting respective threshold levels with voltages applied to a control gate during the execution of two-level or multilevel programming, in which respective threshold levels and the voltage applied to the control gate corresponding to respective threshold levels are linearly related.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a method for programming a nonvolatile memory cell having a control gate, a floating gate, a drain, a source, and a channel region disposed between the drain and source is provided, the method including the steps of applying a first voltage to the control gate to form an inversion layer in the channel region, the first voltage being varied to program at least two threshold levels of the memory cell, applying a second voltage to the drain and a third voltage to the source, the second voltage being greater than the third voltage, monitoring a current flowing between the drain and the source during the programming of the at least two threshold levels, and terminating any one of the first voltage, the second voltage, and the third voltage when the monitored current reaches a preset reference current to thereby stop the programming of the at least two threshold levels.

A nonvolatile memory cell, such as an EEPROM cell, according to the present invention includes a control gate, a floating gate, a drain, a source and a channel region disposed between the drain and source. A preferred programming method of the present invention is performed by applying a first voltage varied corresponding to the respective threshold levels during a programming of at least two threshold levels of the control gate for programming the EEPROM cell and forming an inversion layer in the channel region. Thereafter, a second voltage and a third voltage are applied to the drain and source, respectively, in such a manner that the voltage applied to the drain is higher than that applied to the source.

Then, current flowing between the drain and source is monitored while programming the respective threshold levels of the EEPROM cell, and the supply of any one among the first voltage, second voltage and third voltage respectively applied to the control gate, drain and source is terminated for stopping the programming when the monitored current reaches a preset reference current.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2:
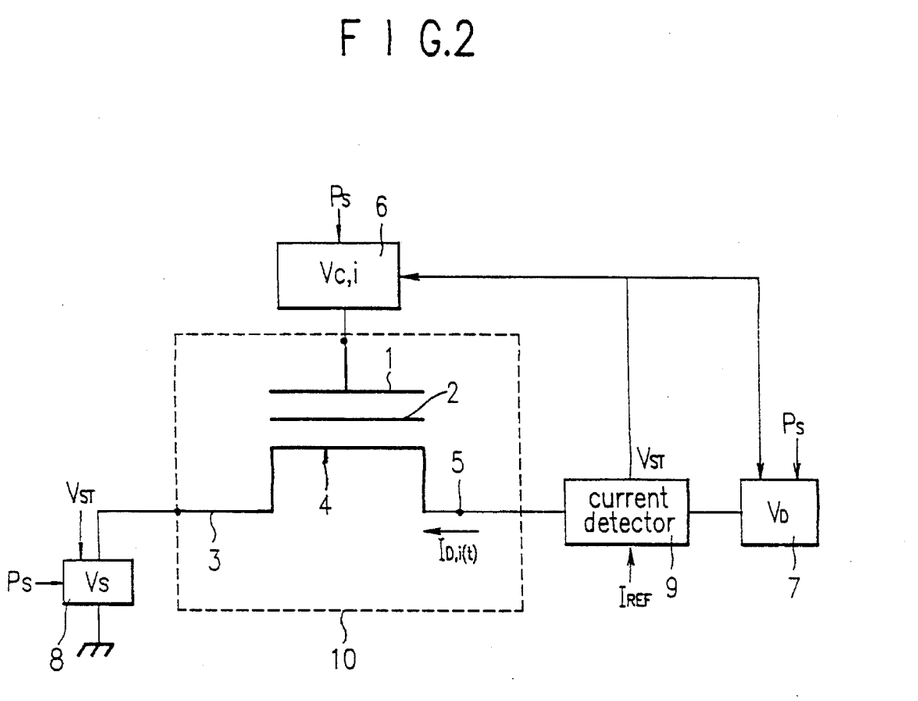
FIG. 2 is a diagram illustrating a programming method using a current detection according to an embodiment of the present invention.

FIG. 2 is a diagram showing the construction of a nonvolatile memory device for describing a programming method according to the present invention. The nonvolatile memory device shown in FIG. 2 comprises a first voltage source 6, a second voltage source 7, a third voltage source 8, a current detector 9, and an EEPROM cell 10. Ps designates an externally-supplied programming start signal, and $V_{ST}$ designates a programming stop signal. FIG. 1A shows the most general structure of the EEPROM cell 10. In other words, the typical nonvolatile memory cell of a variety of types, such as a simple stacked gate and a split-channel structure, can be simplified in an operational programming mode resulting in the structure shown in FIG. 1A.

First voltage source 6 supplies a voltage $V_{C,i}$ (where i=0, 1, 2, ... and n−1) to a control gate 1 of the EEPROM cell 10 for programming an ith threshold level in a multilevel programming. Accordingly, voltage $V_{C,i}$ has a different value for each level. Second voltage source 7 supplies a voltage $V_D$ to a drain 5 and third voltage source 8 supplies a voltage $V_S$ to a source 3. Here, any value can be applied as voltage $V_S$, but ground is assumed for voltage $V_S$ for convenience of explanation.

$I_{D,i}(t)$ designates a current flowing to drain 5. Current detector 9 has a reference current value $I_{REF}$, and generates programming stop signal $V_{ST}$ when current $I_{D,i}(t)$ flowing through drain 5 reaches reference current $I_{REF}$ during the programming of the ith threshold level.

Time $t_{p,i}$ denotes an ending time of the ith threshold level programming. At this time, reference current $I_{REF}$ of current detector 9 is determined by an electrical characteristic of EEPROM cell 10 which utilizes the programming method according to the present invention.

When current $I_{D,i}(t)$ of drain 5 is redefined, drain current $I_{D,i}(t)$ depends on time. This current value $I_{D,i}(t)$ denotes the current value at drain 5 triggered by a voltage $V_{F,i}(t)$ at floating gate 2 during the ith level programming. The current $I_{D,i}(t)$ is at a maximum at the beginning of the period of the programming and decreases as the programming proceeds. Also, program stop signal $V_{ST}$ is generated from current detector 9 when it decreases below the reference current $I_{REF}$ of current detector 9.

Under the above-described conditions, a two-level or multilevel programming process will be described with reference to FIGS. 3 and 4. FIGS. 3A to 3G show waveforms at respective nodes of FIG. 2, and FIG. 4 is a flow chart showing the two-level or multilevel programming process according to the present invention. Hereinafter, the method for programming the EEPROM cell 10 of FIG. 2 according to the present invention will now be described in detail with reference to the flow chart of FIG. 4.

For programming EEPROM cell 10 and forming an inversion layer in channel region 4, a first voltage, which is varied to correspond to every threshold level programming during the programming of at least two threshold levels, is applied to control gate 1, and a second voltage and a third voltage are applied to drain 5 and source 3, respectively, such that the voltage applied to drain 5 is greater than that applied to source 3. Then, the current flowing between drain 5 and source 3 is monitored while programming the respective threshold levels of EEPROM cell 10, and the supply of any one among the first, second, and third voltages respectively applied to control gate 1, drain 5, and source 3 is terminated to stop the programming when the current reaches a predetermined reference current.

This method will be described in detail below. It is assumed that a corresponding cell is under an erased state prior to performing the programming. Here, the erased state denotes a zero level which is the lowest level. It is also assumed that a floating gate FET has a structure with an n-type channel on a p-type substrate.

Figure 3A:
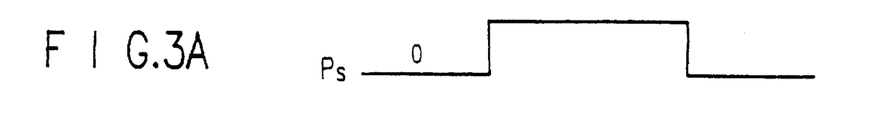
FIGS. 3A to 3G are waveform diagrams for respective nodes of FIG. 2.

First, as shown in FIG. 3A, when programming start signal Ps is externally provided for the two-level or multi-level programming, voltage $V_{C,i}$ applied to control gate 1 is set for the ith level programming. While programming start signal Ps of FIG. 3A is supplied, voltages $V_{C,i}$ shown in FIG. 3B and $V_D$ are supplied from first voltage source 6 and second voltage source 7 to control gate 1 and drain 5, respectively.

In this operation, floating gate 2 is supplied with electrons for the ith threshold level programming. Here, any program mechanism may be used to supply the charge to floating gate 2, but generally, either a hot carrier injection or tunneling mechanism is used.

After voltages $V_{C,i}$ and $V_D$ are applied to control gate 1 and drain 5, respectively, current detector 9 is turned on to monitor the voltage variation at floating gate 2. Once voltages $V_{C,i}$ and $V_D$ are applied to control gate 1 and drain 5, as shown in FIG. 3C, voltage $V_{F,i}(t)$ for the ith threshold level programming is imposed upon floating gate 2, and the inversion layer is formed in channel region 4 of the FET. Actually, since source 3, drain 5, and channel region 4 are placed on a semiconductor substrate (not shown), the current flows from drain 5 to source 3 via channel region 4 once the inversion layer is formed. At this time, current $I_{D,i}(t)$ flows to drain 5, which is at a maximum at the beginning of the period as shown in FIG. 3D, and the electrons are injected into floating gate 2 along with the progression of the programming to decrease the floating gate voltage, so that current $I_{D,i}(t)$ also decreases.

As described above, current detector 9 monitors drain current $I_{D,i}(t)$ during the ith threshold level programming. When the monitored value reaches reference current $I_{REF}$, as shown in FIG. 3D, the ith threshold level programming is considered to be complete and programming stop signal $V_{ST}$ is output as shown in FIG. 3E. Here, it is described that current detector 9 monitors current $I_{D,i}(t)$, which substantially, as shown in FIGS. 3C and 3G, can be described by monitoring the variation of the voltage or amount of charge at floating gate 2 during the programming.

That is, as shown in FIG. 3C, the floating gate voltage reaches a reference voltage $V^F_{REF}$ at floating gate 2 corresponding to reference current $I_{REF}$ when the drain current reaches reference current $I_{REF}$. In addition, the monitoring of current $I_{D,i}(t)$ can be described by monitoring the conductivity of the inversion layer formed in channel region 4 of FIG. 2.

Figure 3B:
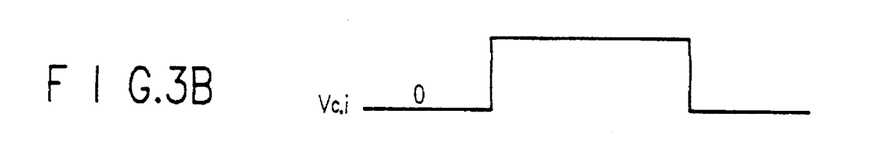
Figure 3C:
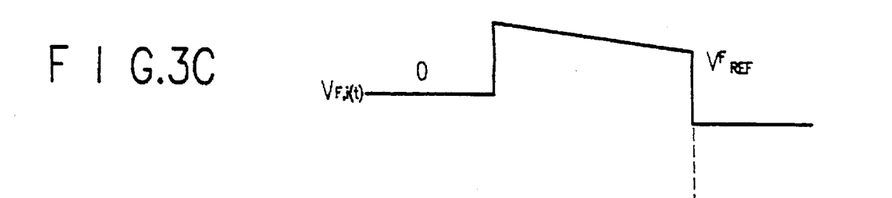
Figure 3D:
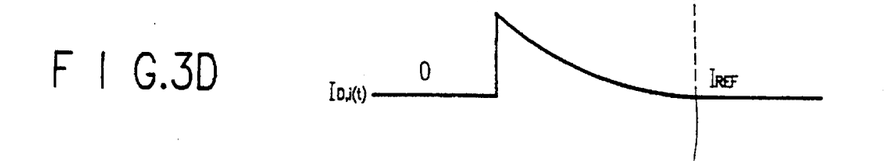
Figure 3E:
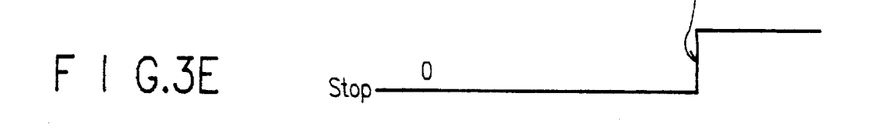
Figure 4:
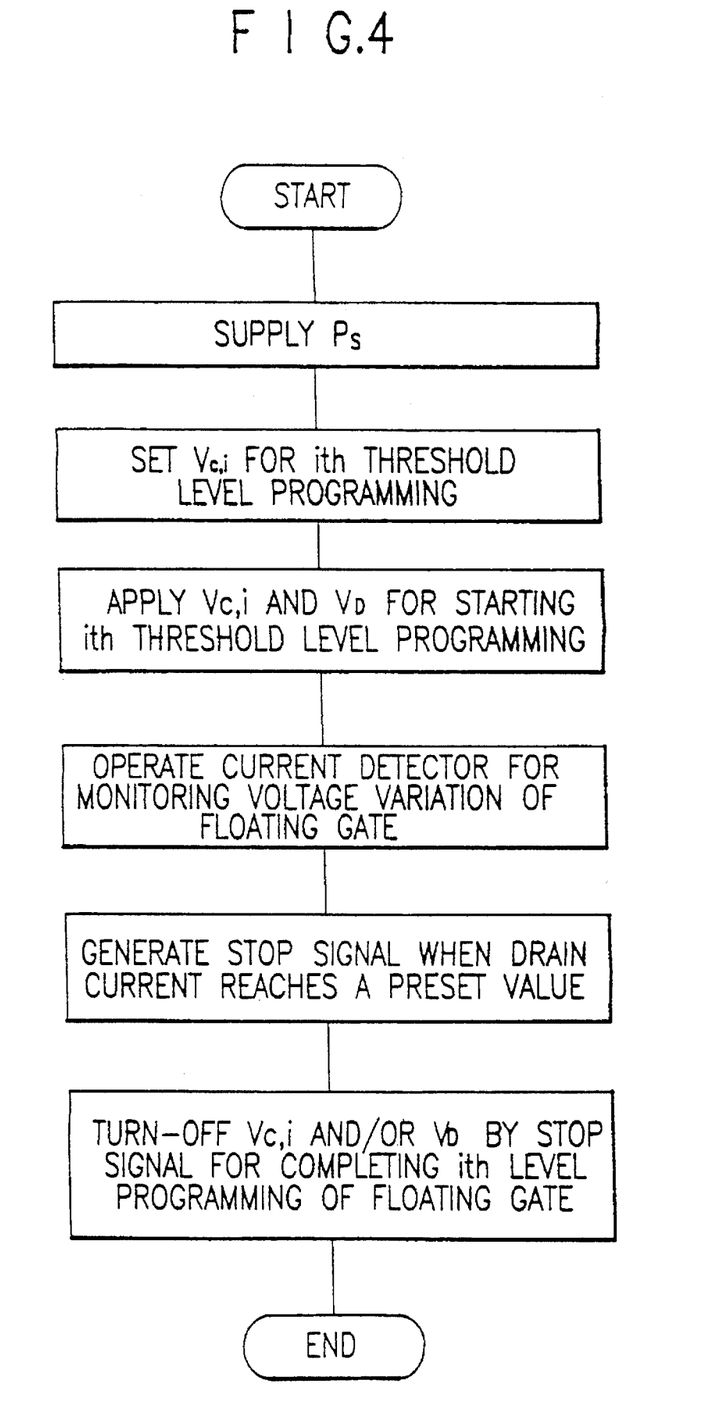
FIG. 4 is a flowchart of the two-level or multilevel programming process according to a preferred embodiment of the present invention.

In FIG. 2, programming stop signal $V_{ST}$ is provided to first and second voltage sources 6 and 7, and first and/or second voltage sources 6 and 7 stop the supply of voltages $V_{C,i}$ and $V_D$ to control gate 1 and drain 5 in response to programming stop signal $V_{ST}$ as shown in FIG. 3B. In other words, if current $I_{D,i}(t)$ is less than reference current $I_{REF}$ at the time $t=t_{p,i}$, the ith threshold level programming is completed. Therefore, time $t_{p,i}$ denotes the time of programming the ith threshold level.

Figure 3F:
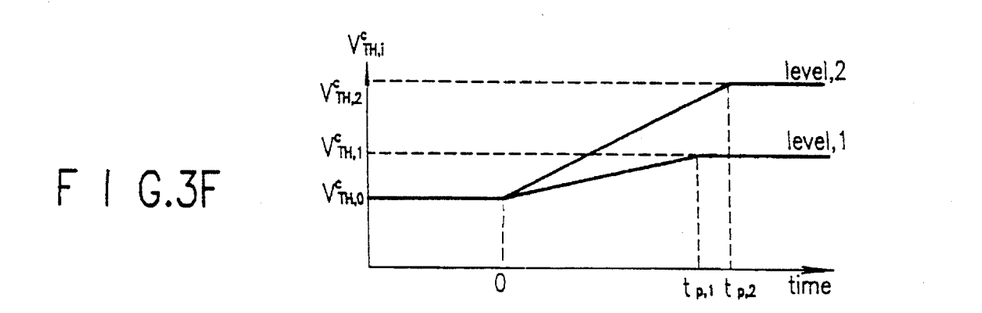
Figure 3G:
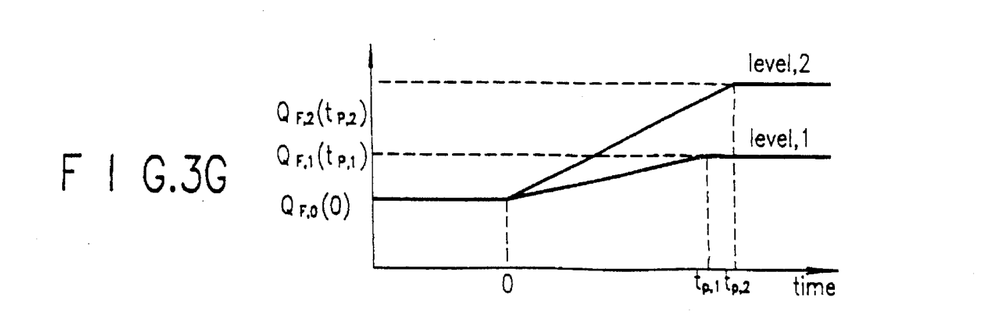

FIG. 3F represents the variation of threshold voltages $V^C_{TH,1}$ and $V^C_{TH,2}$ at control gate 1 with respect to the time for the programming of the first and second threshold levels. Also, FIG. 3F illustrates the increase of threshold voltage $V^C_{TH,1}$ at control gate 1 as the degree of the level increases during the multilevel programming. This is obtained by increasing voltage $V_{C,i}$ during the programming. Here, the programming times $t_{p,1}$ and $t_{p,2}$ of the first and second levels are different because of the different amounts of variation of the control gate voltage and threshold voltage corresponding to respective levels.

On the other hand, FIG. 3G is a plot of the charge variation at floating gate 2 from an initial charge amount $Q_{F,0}(0)$ at floating gate 2 to the charge amount $Q_{F,1}(t_{p,1})$ when the first threshold level programming is complete and the charge amount $Q_{F,2}(t_{p,2})$ when the second threshold level programming is complete, in case of the first and second threshold levels. As shown in FIG. 3G, the charge amount at floating gate 2 increases from the initial value $Q_{F,0}(0)$ to respective charge amounts $Q_{F,1}(t_{p,1})$ and $Q_{F,2}(t_{p,2})$ when voltages $V_{F,1}(t)$ and $V_{F,2}(t)$ (where $t=t_{p,1}$ and $t=t_{p,2}$) at floating gate 2 reach reference voltage $V^F_{REF}$ at floating gate 2 corresponding to reference current $I_{REF}$.

Figure 5A:
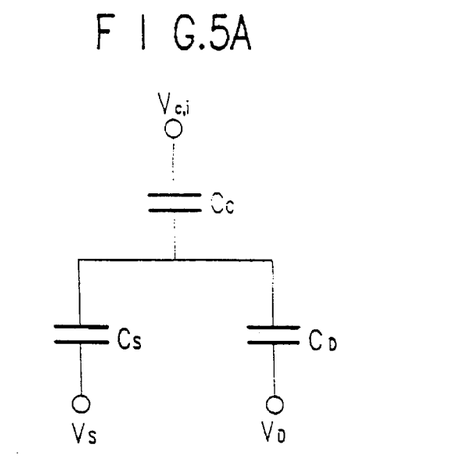
FIG. 5A is an equivalent circuit diagram of the nonvolatile memory cell shown in FIG. 1A illustrating the capacitance.

Referring to FIG. 5A, the relationship between voltage $V_{C,i}$ applied to control gate 1 and the threshold voltage of the corresponding level will be described, which is one significant result of the present invention.

FIG. 5A is an equivalent circuit diagram showing the capacitance of the EEPROM cell of FIG. 1A. In FIG. 5A, $C_C$ designates a capacitance between control gate 1 and floating gate 2, $C_D$ is a capacitance between drain 5 and floating gate 2, and $C_S$ is a capacitance between source (including the substrate) and floating gate 2.

A sum $C_T$ of the capacitances can be written as:

$$C_T = C_C + C_D + C_S \tag{1}$$

Also, coupling coefficients of each capacitance are defined as:

$$\alpha_C = C_C/C_T, \quad \alpha_D = C_D/C_T, \quad \alpha_S = C_S/C_T \tag{2}$$

In FIG. 5A, the voltage at floating gate 2 during programming is generally written as:

$$\begin{aligned} V_F(t) &= \alpha_C V_C + \alpha_D V_D + \alpha_S V_S + Q_F(t)/C_T \\ &= \alpha_C [V_C - V^C_{TH}(t)] + \alpha_D V_D + \alpha_S V_S \end{aligned} \tag{3}$$

where reference symbol $Q_F(t)$ designates the charge amount at floating gate 2 at time t. During programming, threshold voltage $V^C_{TH}(t)$ at control gate 1 is defined as:

$$V^C_{TH}(t) = -Q_F(t)/C_C \tag{4}$$

In other words, $V^C_{TH}(t)$ in equation (4) designates a threshold voltage shift measured at control gate 1 at time t. Threshold voltage shift $V^C_{TH}(t)$ denotes a threshold voltage measured at control gate 1 after being caused by the charge stored in floating gate 12.

Also threshold voltage $V^F_{TH}$ at floating gate 3 is an inherent threshold voltage of the FET, consisting of floating gate 2, drain 5, and source 3 of FIG. 1. $V^F_{REF}$ is determined by the manufacturing conditions of the FET, such as a channel ion implantation and the thickness of the gate insulating layer when fabricating the EEPROM cell shown in FIG. 1. Therefore, threshold voltage $V^F_{TH}$ of floating gate 2 is always constant.

However, threshold voltage $V^C_{TH}$ of control gate 1 is determined by the amount of charge $Q_F$ at floating gate 2. The programming of respective threshold levels is forced to stop when voltage $V_F(t)$ at floating gate 2 reaches reference voltage $V^F_{REF}$ at floating gate 2. That is, this point corresponds to the time that current $I_D(t)$ of drain 5 reaches reference current $I_{REF}$, and also corresponds to time $t_p$ the programming is complete.

Thus, voltage $V_F(t_p)$ of floating gate 2 when the threshold level programming is complete is:

$$V_F(t_p) = V^F_{REF} = \alpha_C[V_C - V^C_{TH}(t_p)] + \alpha_D V_D + \alpha_S V_S \tag{5}$$

By rearranging equation (5), voltage $V_C$ applied from first voltage source 6 to control gate 1 is:

$$\begin{aligned} V_C &= V^C_{TH}(t_p) + [V^F_{REF} - \alpha_D V_D - \alpha_S V_S]/\alpha_C \\ &= V^C_{TH}(t_p) + V1 \end{aligned} \tag{6}$$

where:

$$V1 = [V^F_{REF} - \alpha_D V_D - \alpha_S V_S]/\alpha_C \tag{7}$$

Here, by adjusting three parameters of drain voltage $V_D$, source voltage $V_S$, and reference voltage $V^F_{REF}$ such that value V1 is fixed at the programming ending period of the respective level programming, control gate voltage $V_C$ and threshold voltage shift $V^C_{TH}$ are linear with respect to each other. In the simplest method for making V1 fixed, respective drain voltage $V_D$, source voltage $V_S$, and reference voltage $V^F_{REF}$ are fixed with respect to the programming of the respective levels.

However, as expressed in equation (5), drain voltage $V_D$ and source voltage $V_S$ are to have the same value at the ending point of the programming of the respective levels. In other words, although drain voltage $V_D$ and source voltage $V_S$ may be variables differing in accordance with the programming time, the above object can be obtained only by permitting the values to be equal at the ending point of the programming.

In equation (7), if coupling coefficients $\alpha_D$ and $\alpha_S$ are considerably smaller than coupling coefficient $\alpha_C$, the two terms involving coupling coefficients $\alpha_D$ and $\alpha_S$ may be ignored.

In equation (5), the value of control gate voltage $V_C$ of respective levels may be varied in accordance with time. In this case, the value of control gate voltage $V_C$ of respective levels is the value of the ending point of the programming of respective levels.

Value V1 is forced to be constant with respect to every programming level as described above so that control gate voltage $V_{C,i}$ required for the ith threshold level programming is expressed as equation (8) by means of equation (7):

$$V_{C,i}=V_{TH,i}+V1 \text{ (where } i=0, 1, 2, 3 \ldots, n-1) \tag{8}$$

Figure 5B:
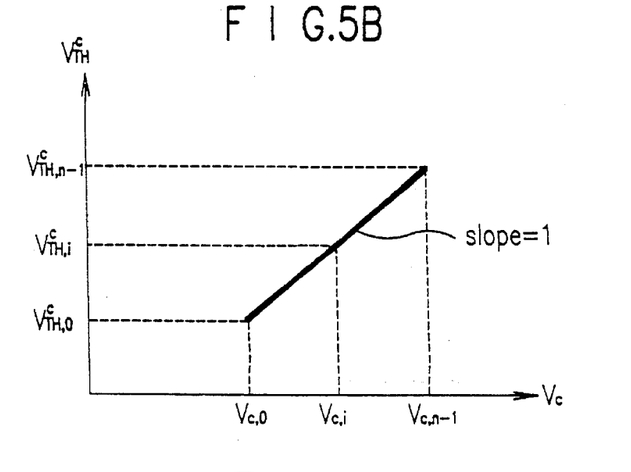
FIG. 5B is a graph of the relationship between the threshold levels to be programmed and the corresponding control gate voltages.

In view of equation (8), it can be realized that the threshold levels desired to be programmed and the control gate voltage applied corresponding to them have the linear relation with a slope of one. FIG. 5B illustrates the result. Here, it also can be noted from equation (4) that the charge amount of floating gate 2 is linear with respect to the control gate voltages.

Since value V1 is constant as described above, an ith shift value $\Delta V_{C,i}$ of the voltage applied to control gate 1 during the multilevel programming is expressed as:

$$\Delta V_{C,i}=\Delta V^C_{TH,i} \tag{9}$$

From equations (8) and (9), when shift value $\Delta V^C_{TH,i}$ goes from the erased state, i.e., the lowest level, to one of the respective threshold levels determined during the two-level or multilevel programming, the programming of the corresponding level is performed so that a value, obtained by adding the desired threshold level shift value $\Delta V^C_{TH,i}$ to a value $V_{C,0}$ of the previously known lowest level programming, is applied to the control gate voltage. One then waits for the automatic completion of the programming.

Figure 5C:
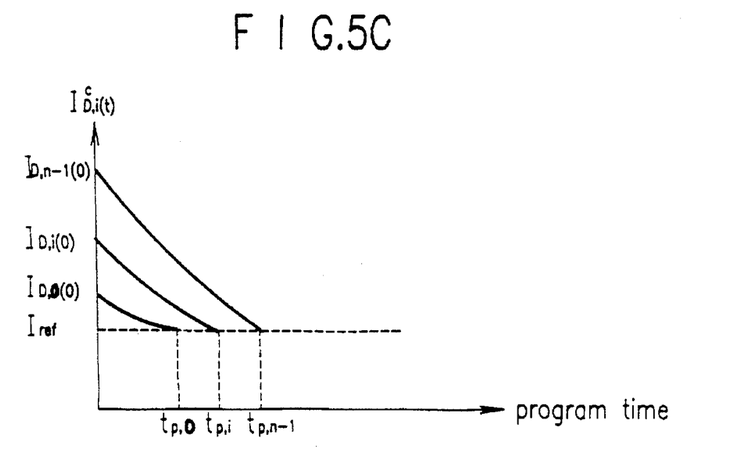
FIG. 5C is a plot of the drain current variation from the start to the completion of the programming for the respective levels.

Here, since reference voltage $V^F_{REF}$ is a constant and control gate voltage $V_{C,i}$ increases as it reaches a higher level with respect to the programming of the respective levels, the initial value $I_{D,i}(0)$ of the drain current increases as it reaches the higher level. This process is illustrated in FIG. 5C. Also, the programming completion point of the respective levels is varied according to the electrical characteristics of the memory cells and the voltages applied to the respective nodes.

A method for determining control gate voltage $V_{c,0}$ and reference current value $I_{REF}$ for performing the programming of the lowest level will now be described.

To begin, two parameters of control gate voltage $V_{c,0}$ and reference current $I_{REF}$ at floating gate 2 remain in equations (7) and (8) if the desired lowest level value $V^C_{TH,0}$ drain voltage $V_D$ and source voltage $V_S$ of the selected memory cell are determined. Here, since drain voltage $V_D$ and source voltage $V_S$ are constants, reference voltage $V^F_{REF}$ corresponds to reference current value $I_{REF}$ on a one-to-one basis.

The memory cell is adjusted to the desired lowest level value $V^C_{TH,0}$ and voltages $V_{C,0}$, $V_D$, and $V_S$ are applied to the memory cell. Then, initial drain current value $I_{D,0}(0)$ is measured which becomes the reference current value. Here, voltage $V_{C,0}$ is determined in consideration of the programming time and the maximum control gate voltage $V_{c,n-1}$. Once voltage $V_{C,0}$ is determined, the reference current value can be obtained by the above-described method. The reference current value can also be measured using several other methods.

In the foregoing description, the value V1 of equation (7) is fixed with respect to the programming of respective levels. If the parameters of equation (7) are adjusted to vary the value V1 for the programming of the respective levels, control gate voltage $V_{C,i}$ and the corresponding threshold voltage $V^C_{TH,i}$ have a nonlinear relationship as shown by equation (8). Therefore, the shift value of the control gate voltage and the shift value of the corresponding threshold voltage differ. In this case, reference current $I_{REF}$ is properly adjusted by a desired value for each level to enable the programming of the threshold voltage corresponding to each level. Only that, since control gate voltage $V_{C,i}$ and the corresponding threshold voltage $V^C_{TH,i}$ have a nonlinear relationship, their relationship can be experimentally determined.

Moreover, the concept of the present invention described herein is explained regardless of the programming mechanism. Thus, it can be realized that the concept of the present invention is applicable to the programming mechanism of any system expressed by equation (3).

If the hot carrier injection system is employed, the source voltage is grounded, and the drain voltage and control gate voltage are applied with a positive voltage sufficiently high enough to cause the programming by hot carrier injection. At this time, the current flows between drain 5 and source 3, and this programming current is monitored to stop the programming when the current reaches reference current $I_{REF}$.

When the tunneling system is employed, a positive voltage is applied to control gate 1, and a negative (or zero) voltage is applied to drain 5 and source 3. As a result, a sufficient electrical field is imposed to cause tunneling between floating gate 2 and drain 5, source 3, or channel region 4. At this time, the drain voltage is greater than the source voltage thereby allowing the current to flow between drain 5 and source 3. The current is monitored to stop the programming when the current reaches reference current $I_{REF}$. If a negative voltage is applied to drain 5 or source 3, a smaller or equal voltage is applied to the substrate when drain 5 and source 3 are n-type semiconductor impurity regions and the substrate is a p-type semiconductor.

Heretofore, the two-level or multilevel programming method is described. Hereinafter, an erasure method using the above programming system will be described.

In connection with the erasure, voltages are applied to respective nodes to impose an electric field strong enough to erase the charge carriers between floating gate 2 and source 3, drain 5, or channel region 4, thereby erasing the charge carriers to source 3, drain 5, or channel region 4 through tunneling. According to the present invention, the erased state denotes the lowest threshold level, i.e., $V^C_{TH,0}$. In other words, all EEPROM cells within a given erasure block are programmed at the lowest level. Thus, the erasing process is easily carried out by the following steps.

First, the threshold levels of all cells within a selected block are erased to below level zero, i.e., below $V^C_{TH,0}$.

Successively, all selected cells are programmed with the level zero value, i.e., the voltage of control gate 1 is $V_{c,0}$. Here, the value of $V_{c,0}$ can be set by a proper value as described above. Since the erasure state is attained by the above-stated programming mechanism in actual aspect, a problem of excessive erasure can be solved.

The programming method according to the present invention as described above has the following advantages.

First, multilevel programming is easily executed since only the voltage of the control gate is changed for each programming of respective threshold levels.

Second, respective threshold voltage levels and respective control gate voltages corresponding to them have a linear relationship to each other, and the shift value of the threshold voltage is the same as the shift value of the control gate voltage, thereby enabling the accurate adjustment of the threshold voltage shift of respective levels.

Third, since the erased state is adjusted by an optional control gate voltage with the programming of the lowest level, there is essentially no problem of excessive erasure.

Fourth, the EEPROM cell inherently performs programming and reading simultaneously, so that a separate circuit for verifying the programmed content is not required, and consequently the programming speed is increased.

Fifth, a previous programming is not needed before executing the erasure.

Sixth, the accuracy of the multilevel programming, i.e., error distribution of the programmed threshold voltages, is accurately determined by the parameters fixed during the fabrication of the nonvolatile memory and application of the bias voltage. Therefore, the threshold voltage error distribution of respective levels of the nonvolatile memory according to the present invention is not dependent on many programming/erasing cycles. Furthermore, programming is performed independent of the trap of the charge, channel mobility, bit line resistance, and unstable or unpredictable electrical elements.

Seventh, since the programming system of the nonvolatile memory according to the present invention is a voltage-controlled method by means of the control gate voltage, multilevel programming can be performed more easily and accurately than the current-controlled method.

It will be apparent to those skilled in the art that various modifications and variations can be made in the method for programming a nonvolatile memory of the present invention without departing from the spirit or scope of the invention. Thus, it is intended that the present invention cover the modifications and variations of this invention provided they come within the scope of the appended claims and their equivalents.

What is claimed is:

1. A method for programming a nonvolatile memory cell having a control gate, a floating gate, a drain, a source, and a channel region disposed between the drain and source, the method comprising the steps of:

applying a first voltage to the control gate to form an inversion layer in the channel region, the first voltage being varied to program at least two threshold levels of the memory cell;

applying a second voltage to the drain and a third voltage to the source, the second voltage being greater than the third voltage;

monitoring a current flowing between the drain and the source during the programming of the at least two threshold levels; and terminating any one of the first voltage, the second voltage, and the third voltage when the monitored current reaches a preset reference current to thereby stop the programming of the at least two threshold levels.

2. The method for programming a nonvolatile memory cell according to claim 1, wherein the reference current has a fixed value during the programming of the at least two threshold levels.

3. A method for programming a nonvolatile memory cell having a control gate, a floating gate, a drain, and a source, the method comprising the steps of:

applying a variable first voltage to the control gate;

applying a second voltage to the drain and a third voltage to the source;

monitoring a current flowing between the drain and the source during application of the first voltage to the control gate; and terminating application of any of the first voltage to the control gate, the second voltage to the drain, and the third voltage to the source when the monitored current reaches a reference current.

4. The method for programming a nonvolatile memory cell according to claim 3, wherein the step of monitoring the current includes the step of monitoring a voltage at the floating gate.

5. The method for programming a nonvolatile memory cell according to claim 3, wherein the step of monitoring the current includes the step of monitoring an amount of charge at the floating gate.

6. The method for programming a nonvolatile memory cell according to claim 3, wherein application of the first voltage to the control gate forms an inversion layer in a channel region disposed between the drain and the source.

7. The method for programming a nonvolatile memory cell according to claim 6, wherein the step of monitoring the current includes the step of monitoring a conductivity of the inversion layer.

8. The method for programming a nonvolatile memory cell according to claim 3, wherein the first voltage is varied linearly with respect to at least two threshold levels of the memory cell.

9. The method for programming a nonvolatile memory cell according to claim 3, wherein the second voltage is greater than the third voltage.

10. The method for programming a nonvolatile memory cell according to claim 3, wherein the reference current is a fixed reference current.

11. A method for programming at least two threshold levels of a nonvolatile memory cell, the memory cell having a control gate, a floating gate, a drain, and a source, the method comprising the steps of:

applying a first voltage to the control gate, the first voltage corresponding to a respective one of the at least two threshold levels;

applying a second voltage to the drain and a third voltage to the source;

monitoring a current flowing between the drain and the source during application of the first voltage to the control gate; and terminating application of any of the first voltage to the control gate, the second voltage to the drain, and the third voltage to the source when the monitored current reaches a reference current.

12. The method for programming a nonvolatile memory cell according to claim 11, wherein the step of monitoring the current includes the step of monitoring a voltage at the floating gate.

13. The method for programming a nonvolatile memory cell according to claim 11, wherein the step of monitoring the current includes the step of monitoring an amount of charge at the floating gate.

14. The method for programming a nonvolatile memory cell according to claim 11, wherein application of the first voltage to the control gate forms an inversion layer in a channel region disposed between the drain and the source.

15. The method for programming a nonvolatile memory cell according to claim 14, wherein the step of monitoring the current includes the step of monitoring a conductivity of the inversion layer.

16. The method for programming a nonvolatile memory cell according to claim 11, wherein the first voltage is selected according to a linear relationship with the at least two threshold levels.

17. The method for programming a nonvolatile memory cell according to claim 11, wherein the second voltage is greater than the third voltage.

18. The method for programming a nonvolatile memory cell according to claim 11, wherein the reference current is a fixed reference current.

19. The method for programming a nonvolatile memory cell according to claim 11, wherein the reference current is a fixed reference current.

* * * * *